US012568698B2

(12) United States Patent
Goto

(10) Patent No.: US 12,568,698 B2
(45) Date of Patent: Mar. 3, 2026

(54) SOLID-STATE IMAGE SENSOR AND IMAGING SYSTEM

(71) Applicant: TOPPAN Inc., Taito-ku (JP)

(72) Inventor: Hiroshige Goto, Taito-ku (JP)

(73) Assignee: TOPPAN Inc., Taito-ku (JP)

( * ) Notice: Subject to any disclaimer, the term of this patent is extended or adjusted under 35 U.S.C. 154(b) by 594 days.

(21) Appl. No.: 17/935,336

(22) Filed: Sep. 26, 2022

(65) Prior Publication Data

US 2023/0014856 A1     Jan. 19, 2023

Related U.S. Application Data

(63) Continuation of application No. PCT/JP2021/009537, filed on Mar. 10, 2021.

(30) Foreign Application Priority Data

Mar. 25, 2020     (JP) ................................. 2020-054149

(51) Int. Cl.
  *H10F 39/18*          (2025.01)
  *H04N 25/60*          (2023.01)
          (Continued)

(52) U.S. Cl.
  CPC ........... *H10F 39/184* (2025.01); *H04N 25/60* (2023.01); *H04N 25/62* (2023.01); *H04N 25/771* (2023.01); *H10F 39/8037* (2025.01)

(58) Field of Classification Search
  CPC .. H10F 39/184; H10F 39/8037; H10F 39/809; H04N 25/60; H04N 25/62; H04N 25/771; H04N 25/79; Y02E 10/547
  See application file for complete search history.

(56) References Cited

U.S. PATENT DOCUMENTS 10,256,264 B2 *   4/2019   Na et al. ............. H10F 39/8023
2017/0040362 A1   2/2017   Na et al.
          (Continued)

FOREIGN PATENT DOCUMENTS

EP     3 332 426 A1     6/2018
EP     3 610 510        2/2020
          (Continued)

OTHER PUBLICATIONS

Extended European Search Report issued Jul. 26, 2023 in European Application No. 21775284.9, 7 pages.
          (Continued)

*Primary Examiner* — Christine S. Kim
*Assistant Examiner* — Nathalie R Fayette
(74) *Attorney, Agent, or Firm* — Oblon, McClelland, Maier & Neustadt, L.L.P.

(57)          ABSTRACT

A solid-state image sensor includes a first semiconductor, and a second semiconductor having a composition different from that of the first composition and electrically connected to the first semiconductor. The first semiconductor includes a photodiode that converts light incident on the photodiode into charge carriers, first carrier storages that store the charge carriers, and a transfer gate that controls transfer the charge carriers to a selected one of the first carrier storages. The second semiconductor includes second carrier storages and a potential detection node. The second carrier storages each store charge carriers based on the charge carriers stored in a corresponding one of the first carrier storages. The potential detection node detects the electric potential of each of the second carrier storages. The solid-state image sensor further includes a reset transistor that resets the electric potential of each of the first carrier storages to a predetermined electric potential.

9 Claims, 7 Drawing Sheets

(51) Int. Cl.
   *H04N 25/62*        (2023.01)
   *H04N 25/771*      (2023.01)
   *H10F 39/00*        (2025.01)

(56)                              References Cited

U.S. PATENT DOCUMENTS

2018/0331138 A1 * 11/2018 Agranov et al. ....... H04N 25/65
2021/0270941 A1      9/2021 Watanabe et al.

FOREIGN PATENT DOCUMENTS

WO      WO 2018/191539 A1     10/2018
WO      WO 2020/017345 A1       1/2020

OTHER PUBLICATIONS

International Search Report issued Jun. 8, 2021 in PCT/JP2021/
009537, filed on Mar. 10, 2021, 5 pages (with English Translation).

* cited by examiner

SOLID-STATE IMAGE SENSOR AND IMAGING SYSTEM

CROSS-REFERENCE TO RELATED APPLICATIONS

The present application is a continuation of International Application No. PCT/JP2021/009537, filed Mar. 10, 2021, which is based upon and claims the benefits of priority to Japanese Application No. 2020-054149, filed Mar. 25, 2020. The entire contents of all of the above applications are incorporated herein by reference.

BACKGROUND OF THE INVENTION

Field of the Invention

The present invention relates to solid-state image sensors and imaging systems.

Discussion of the Background

Solid-state imaging devices are used in various fields. As one example, solid-state imaging devices are used in imaging systems that can measure distances to objects.

Such imaging systems typically include a light source for producing light to be emitted toward an object, and a solid-state imaging device. The imaging device functions as an image sensor that captures an image of light reflected from the object One issue with the above imaging device is noise due to external light. One measure which has been considered to reduce this noise is to use near-infrared or short-wave infrared light at wavelengths that sunlight contains little of (preferably, light at wavelengths of about 1350 nm to 1400 nm that sunlight contains little of). This allows the above imaging device to be substantially unaffected by many types of external light, including sunlight.

Providing an imaging system capable of measuring distances to objects using light in such a wavelength range requires a solid-state imaging device that efficiently converts light in that range into charge carriers. For this reason, germanium (Ge) and the like having a high absorption coefficient have been considered for use.

PTL 1 describes a device having photodiodes formed in a layer containing Ge and silicon (Si).

PTL 1: US 2017/0040362 A

SUMMARY OF THE INVENTION

According to an aspect of the present invention, a solid-state image sensor includes a first semiconductor having a first composition and including a photodiode that converts light incident on the photodiode into charge carriers, first carrier storages that store the charge carriers, and a transfer controller that controls transfer of the charge carriers to a selected one of the first carrier storages; a second semiconductor having a second composition different from the first composition, the second semiconductor being electrically connected to the first semiconductor, the second semiconductor including second carrier storages corresponding to the respective first carrier storages, each of the second carrier storages being for storing charge carriers based on the charge carriers stored in a corresponding one of the first carrier storages, and a potential detector that detects an electric potential of each of the second carrier storages; and a resetter that resets an electric potential of each of the first carrier storages to a predetermined electric potential.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9 is a partial schematic diagram illustrating a solid-state image sensor according to a modification of the present invention.

DESCRIPTION OF THE EMBODIMENTS

Figure 1:
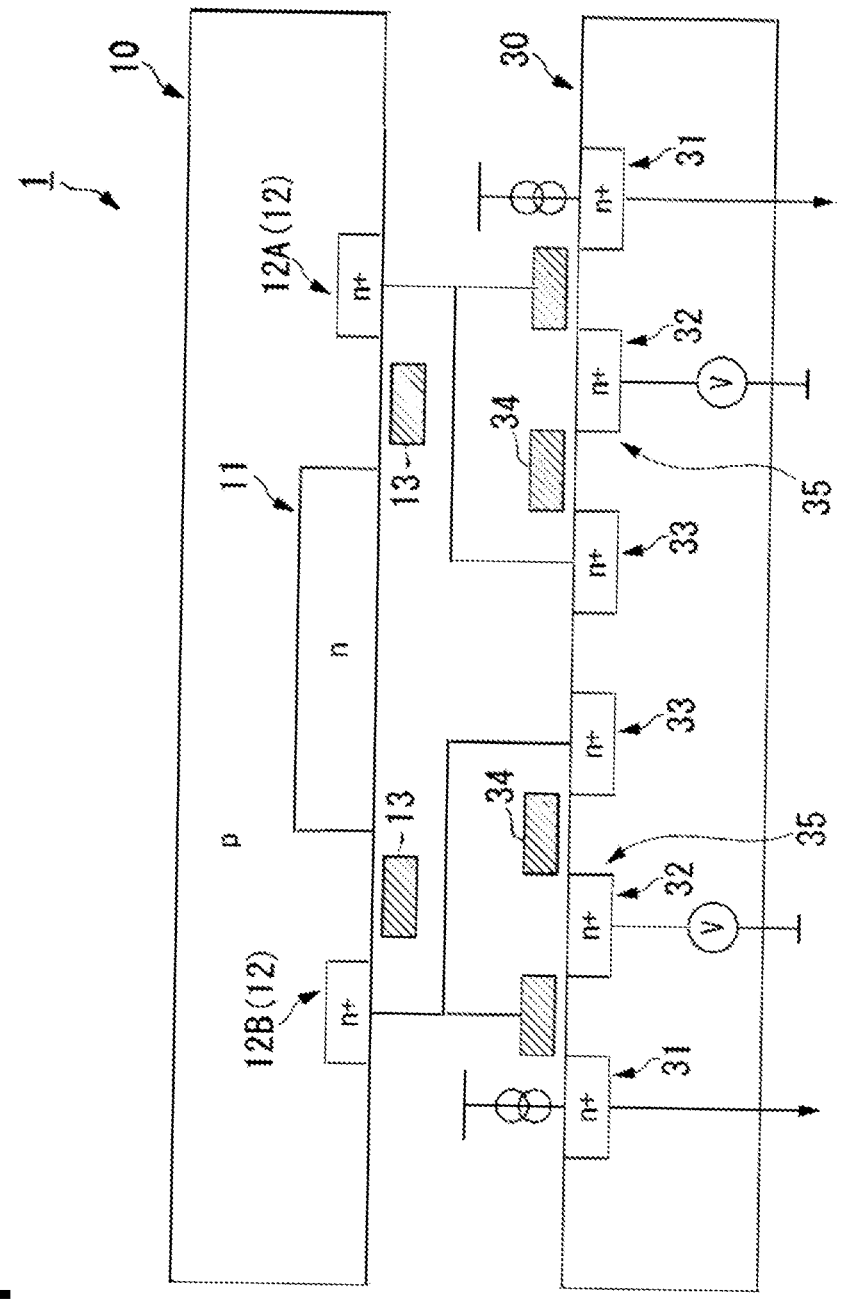
FIG. 1 is a schematic diagram illustrating a solid-state image sensor according to an embodiment of the present invention.

The embodiments will now be described with reference to the accompanying drawings, wherein like reference numerals designate corresponding or identical elements throughout the various drawings.

With reference to FIGS. 1 to 4, an embodiment of the present invention will be described.

FIG. 1 is a schematic diagram illustrating the configuration of a solid-state image sensor 1 according to the present embodiment. The solid-state image sensor 1 includes a first semiconductor 10 and a second semiconductor 30 electrically connected to each other. The first semiconductor 10 and the second semiconductor 30 have different compositions of constituent elements and different lattice constants.

The first semiconductor 10 includes a known photodiode (PD) 11 and thus is configured to perform photoelectric conversion from incident light into signal charge carriers and to store the signal charge carriers. The photodiode 11 may be omitted depending, for example, on the concentration of impurities in the first semiconductor 10. In the present case, the geometric region of the first semiconductor 10 occupied by the photodiode 11 has a function of performing the photoelectric conversion.

At least the portion of the first semiconductor 10 occupied by the photodiode 11 is composed of a high proportion of elements or compounds that are excellent in properties of absorbing near-infrared or short-wave infrared light, in particular light in a wavelength range from about 1350 nm to 1400 nm. A typical example of such a material is Ge, and other examples thereof include germanium compounds, such as germanium-silicon (GeSi), and gallium antimonide (GaSb). In the following description, these materials may be collectively referred to as "Ge or the like".

The physical structure of the first semiconductor 10 is not particularly limited. The entire first semiconductor 10 may be composed of Ge alone or a mixed crystal including Ge or the like. Alternatively, the first semiconductor 10 may include layers of Ge or the like alternating with layers of another material, such as silicon or the like.

Although the following description is provided assuming that the first semiconductor 10 is of a p-type, the same description applies to the case where the first semiconductor 10 is of an n-type. In the drawings, a p-type semiconductor may be indicated with "p". Similarly, an n-type semiconductor may be indicated with "n", a p+ semiconductor region may be indicated with "p+", and an n+ semiconductor region may be indicated with "n+".

The first semiconductor 10 includes a plurality of first carrier storages 12. Each first carrier storage 12 of the present embodiment may be, for example, an n+ semiconductor region. The first semiconductor 10 includes two first carrier storages 12, namely a first carrier storage 12A and a first carrier storage 12B. The first semiconductor 10 includes first and second transfer gates (transfer controllers) 13 each disposed between the photodiode 11 and a corresponding one of the first carrier storages 12A and 12B. The first and second transfer gates (transfer controllers) 13 each transfer charge carriers generated by the photoelectric conversion to a corresponding one of the first carrier storages 12A and 12B. The transfer gates 13 each have a known structure, for example, a metal-oxide-semiconductor (MOS) structure.

The second semiconductor 30 is a semiconductor provided primarily for signal processing and may be composed of silicon. The second semiconductor 30 is electrically connected to the first semiconductor 10 by interconnection through diffusion layers.

The second semiconductor 30 includes second carrier storages 33, drains 32 of respective reset transistors (resetters) 35, potential detection nodes (potential detectors) 31, and reset gates 34 of the respective reset transistors (resetters) 35. Each second carrier storage 33 is connected to a readout circuit (not illustrated). Each potential detection node (potential detector) 31 detects the electric potential of a corresponding one of the second carrier storages 33. Each reset gate 34 controls the transfer of charge carriers between one of the second carrier storages 33 and the corresponding drain 32.

Each reset transistor (resetter) 35 is configured to reset the electric potential of a corresponding one of the first carrier storages 12 to a predetermined electric potential. Each reset transistor 35 may be, for example, a field-effect-transistor (FET).

Each second carrier storage 33, drain 32, potential detection node 31, and reset gate 34 is provided for a corresponding one of the first carrier storages 12A and 12B. Each potential detection node 31 is configured to detect the electric potential of a corresponding one of the second carrier storages 33.

In the solid-state image sensor 1 of the present embodiment configured as described above, applying a voltage as a control signal to each transfer gate 13 causes charge carriers generated in the photodiode 11 to be transferred to one of the first carrier storages 12A and 12B. A control signal is applied to each transfer gate 13 so as to change with time the destination to which charge carriers generated in the photodiode 11 are transferred; thus, selective carrier transfer is performed.

In the solid-state image sensor 1, charge carriers generated in the photodiode 11 are subjected to selective transfer to one of the first carrier storages 12A and 12B in the first semiconductor 10. In the case of selective transfer to the first carrier storage 12A, the generated charge carriers are transferred to the first carrier storage 12A and the corresponding second carrier storage 33, which are diffusion layers serving as capacitors, and to a capacitor composed of a first gate electrode disposed in the second semiconductor 30 and a line (not illustrated) connecting the first carrier storage 12A to the corresponding second carrier storage 33. In the case of selective transfer to the first carrier storage 12B, the generated charge carriers are transferred to the first carrier storage 12B and the corresponding second carrier storage 33, which are diffusion layers serving as capacitors, and to a capacitor composed of a second gate electrode disposed in the second semiconductor 30 and a line (not illustrated) connecting the first carrier storage 12B to the corresponding second carrier storage 33. Accordingly, the charge carriers transferred to be stored in the capacitors will not be subjected to selective transfer.

In general, selective transfer of charge carriers in a relatively large-capacitance capacitor is prone to characteristics problems. In particular, when high-speed selective transfer of charge carriers is required, a certain amount of time required for transfer of charge carriers from a relatively large-capacitance capacitor may make it difficult to realize good selective transfer characteristics.

The solid-state image sensor 1 of the present embodiment is configured to perform selective transfer of charge carriers in the first semiconductor 10. This configuration does not involve transfer of charge carriers from a large-capacitance capacitor, thus achieving appropriate selective transfer of charge carriers.

As described above, the solid-state image sensor 1 of the present embodiment includes the first semiconductor 10 having the transfer gates 13 as transfer controllers and the first carrier storages 12 as transfer destinations. With this configuration, appropriate selective carrier transfer can be achieved in the solid-state image sensor 1 with a heterojunction between the first and second semiconductors 10 and 30, which are different semiconductors.

In the solid-state image sensor 1, the photodiode 11 of the first semiconductor 10 is composed of Ge or the like as its main material. With this configuration, it can be said that the solid-state image sensor 1 is capable of operating appropriately as a multi-gate ToF sensor that uses near-infrared or short-wave infrared light, in particular light in a wavelength range from about 1350 nm to 1400 nm.

In the present embodiment, the number of the first carrier storages may be set as appropriate. That is, although the first semiconductor has been described as having the two first carrier storages by way of example, three or more first carrier storages may be provided therein.

Figure 2:
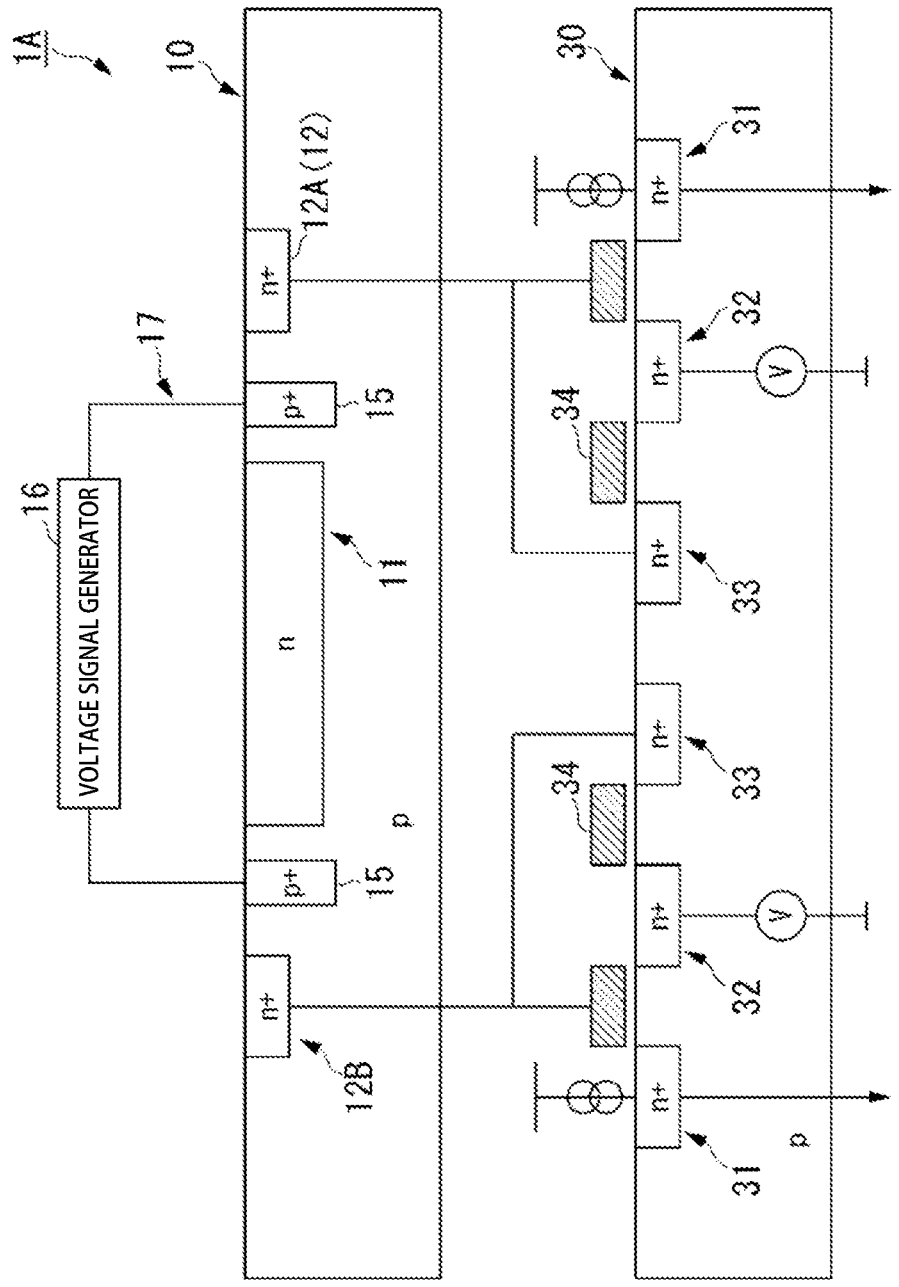
FIG. 2 is a schematic diagram illustrating a modification of the solid-state image sensor.

FIG. 2 is a schematic diagram illustrating a solid-state image sensor 1A according to a modification of the present embodiment. In the solid-state image sensor 1A, the transfer gates 13 are replaced by a first p+ semiconductor region 15 disposed between the photodiode 11 and the first carrier storage 12A and a second p+ semiconductor region 15 disposed between the photodiode 11 and the first carrier storage 12B. Each p+ semiconductor region 15 is connected to a voltage signal generator 16. Charge carriers generated in the photodiode 11 are transferred to one of the first carrier storages 12A and 12B in response to each p+ semiconductor region 15 receiving a signal from the voltage signal generator 16.

That is, the transfer controller 17 of the solid-state image sensor 1A includes the first and second p+ semiconductor regions 15 and the voltage signal generator 16 and performs selective carrier transfer using a known current assisted technique.

In the solid-state image sensor of the present embodiment, the transfer controller configured as such also achieves the effect described above, and thus the transfer controller is not limited to a gate electrode.

Although FIG. 2 illustrates the first and second p+ semiconductor regions 15 each disposed between the photodiode 11 and the corresponding first carrier storage 12, these p+ semiconductor regions 15 may be disposed at any position as long as they are in the vicinity of the respective first carrier storages 12A and 12B.

FIG. 2 illustrates a front-side illumination (FSI) solid-state image sensor where the first semiconductor 10 has the photodiode 11 formed on the side facing away from the second semiconductor. All the solid-state image sensors described in the present specification may have an FSI configuration or a back-side illumination (BSI) configuration, depending, for example, on the use and/or the relation with other configurations.

The solid-state image sensor of the present embodiment can be used singly, but in another possible configuration, solid-state image sensors of the present embodiment may be arranged in a two-dimensional matrix to provide a solid-state imaging device having a plurality of pixels.

Figure 3:
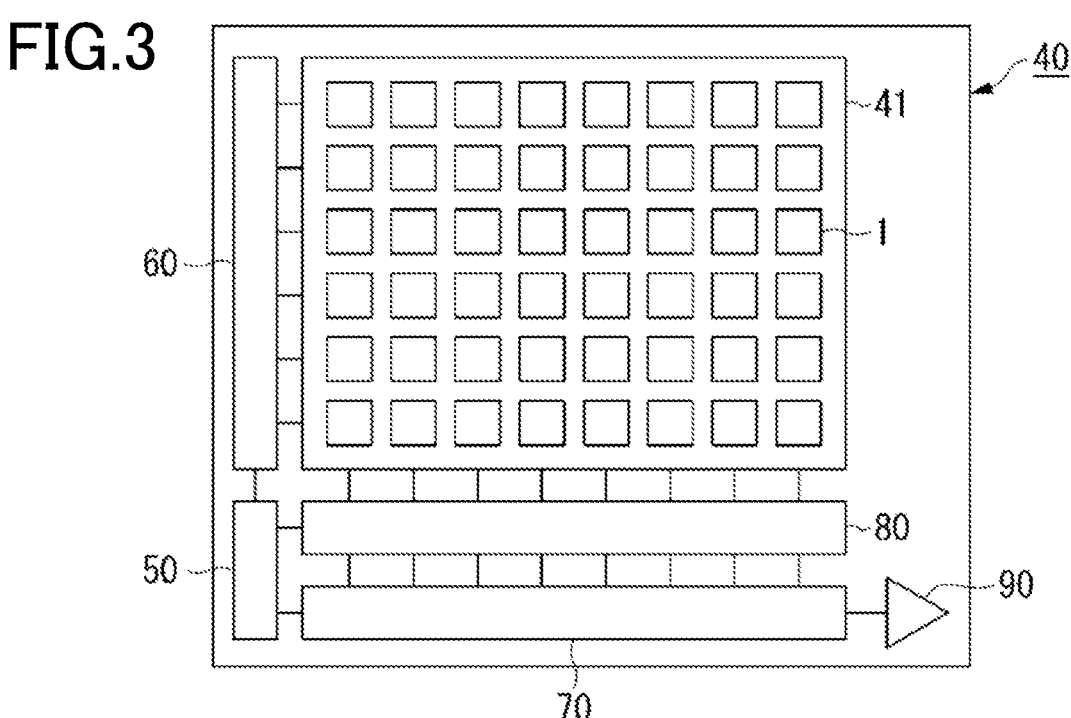
FIG. 3 is a diagram illustrating an example of a solid-state imaging device including a plurality of solid-state image sensors according to the embodiment of the present invention.

FIG. 3 is a block diagram illustrating an example of such an imaging device. The solid-state imaging device 40 includes a light receiving region 41 in which a two-dimensional array of solid-state image sensors 1 is disposed. The solid-state imaging device 40 is illustrated as including, by way of example, a control circuit 50, a vertical driving circuit 60, a horizontal driving circuit 70, an analog-to-digital (AD) conversion circuit 80, and an output circuit 90. The solid-state imaging device 40 may include known various components suitably combined considering, for example, specifications.

For the solid-state imaging device 40, the number and arrangement of solid-state image sensors disposed in the light receiving region 41 may be set as appropriate. The solid-state image sensors may be disposed in a two-dimensional array with no clearance therebetween. In this case, a two-dimensional array of solid-state image sensors may be formed on a single semiconductor wafer.

Figure 4:
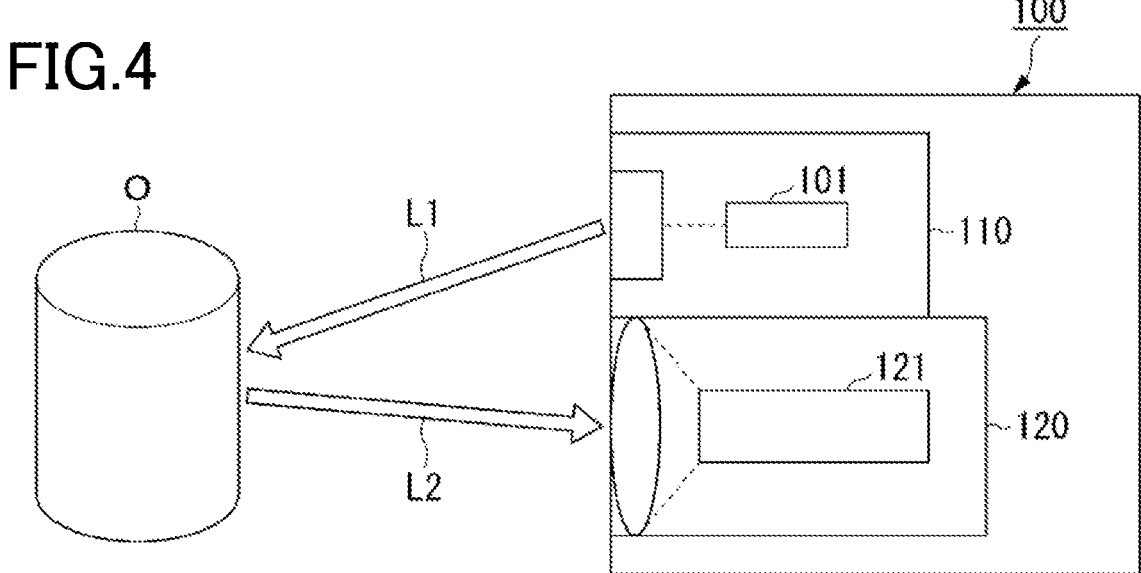
FIG. 4 is a diagram illustrating an example of an imaging system including one or more solid-state image sensors according to the embodiment of the present invention.

FIG. 4 schematically illustrates an example of an imaging system in which the solid-state image sensor of the present embodiment is used. The imaging system 100 of FIG. 4 includes a light source unit 110 having a light source 101, and a light receiving unit 120 having an image sensor 121.

The light source unit 110 includes the light source 101 and, if necessary, a filter, for example, that regulates the wavelength of light emitted from the light source 101. The light source unit 110 is configured to emit, to an object O, outgoing light L1 having a predetermined wavelength in a predetermined wavelength range (wavelength profile). The outgoing light L1 may be near-infrared or short-wave infrared light (e.g., light in a wavelength range from about 1350 nm to 1400 nm). The outgoing light L1 will be reflected by the object O as reflected light L2, and the reflected light L2 will be incident on the image sensor 121 of the light receiving unit 120. The image sensor 121 may be composed of one or more solid-state image sensors of the present embodiment.

When the outgoing light L1 has, as the wavelength profile, a wavelength in a wavelength range from about 1350 nm to 1400 nm, the imaging system 100 can, for example, measure distances to objects using a ToF technique while being substantially unaffected by external light even when used outdoors.

An embodiment of the present invention has been described in detail with reference to the drawings. However, specific configurations are not limited to this embodiment. The present invention can encompass modifications, combinations, and the like of the configurations without departing from the spirit of the present invention.

Figure 5:
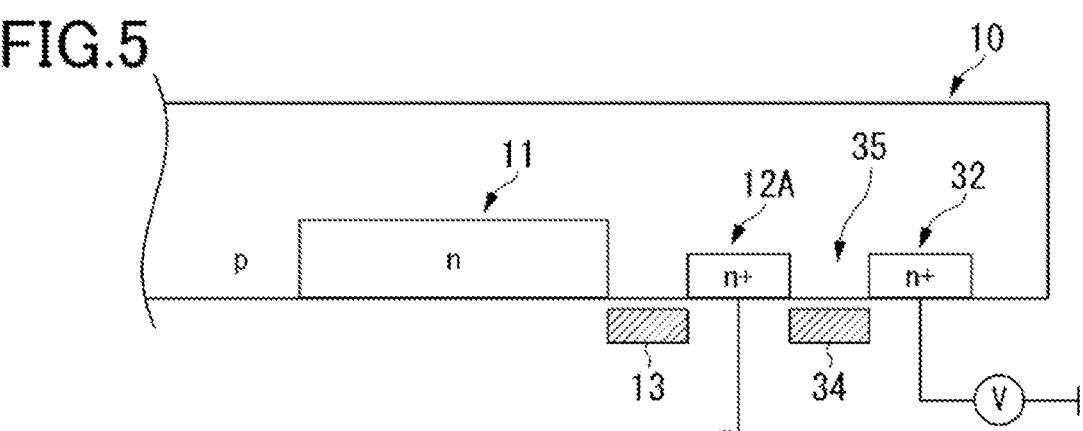
FIG. 5 is a partial schematic diagram illustrating a solid-state image sensor according to a modification of the present invention.

For example, as with the modification illustrated in FIG. 5, the first semiconductor 10 may be provided with the drains 32 and reset gates 34 of the respective reset transistors 35. In this case, because the first semiconductor 10 is capacitively coupled to the second semiconductor 30 via high-resistance gate electrodes, charge carriers subjected to selective transfer will move within the first semiconductor 10. This configuration provides a high degree of freedom in setting, for example, a reset voltage, and prevents contamination of charge carriers with noise through the respective second carrier storages 33, which are diffusion layers, to thereby achieve improved characteristics.

The configuration of the reset transistor is not limited to the example illustrated in FIG. 5.

Figure 6:
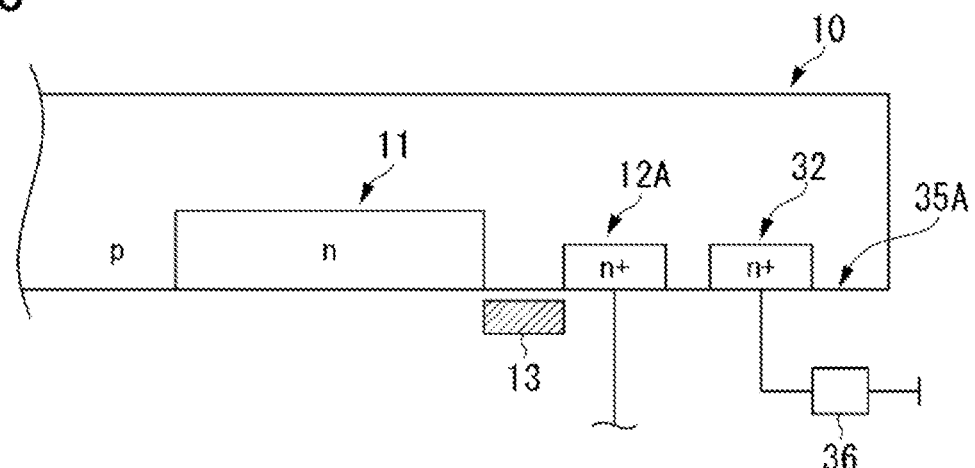
FIG. 6 is a partial schematic diagram illustrating a solid-state image sensor according to a modification of the present invention.

Reset transistors (resetters) 35A of the modification illustrated in FIG. 6 include respective voltage signal generators 36, with the reset gates 34 omitted. A voltage applied to a drain 32 will increase in response to a signal from the corresponding voltage signal generator 36, resulting in a depletion layer adjacent the drain 32 being coupled to a depletion layer of the corresponding first carrier storage 12A. Consequently, the electric potential of the first carrier storage 12A is set to a characteristic voltage determined by the electric potential distribution of a coupled depletion layer. That is, the first carrier storage 12A can be reset. Thus, the electric potential of the first carrier storage can be reset without a FET gate, such as the reset gate 34. For the reset operation to be performed with good controllability, the concentration of impurities may be different between each first carrier storage and the corresponding drain 32. For the same purpose, a suitable impurity region may be disposed between each first carrier storage and the corresponding drain 32.

Figure 7:
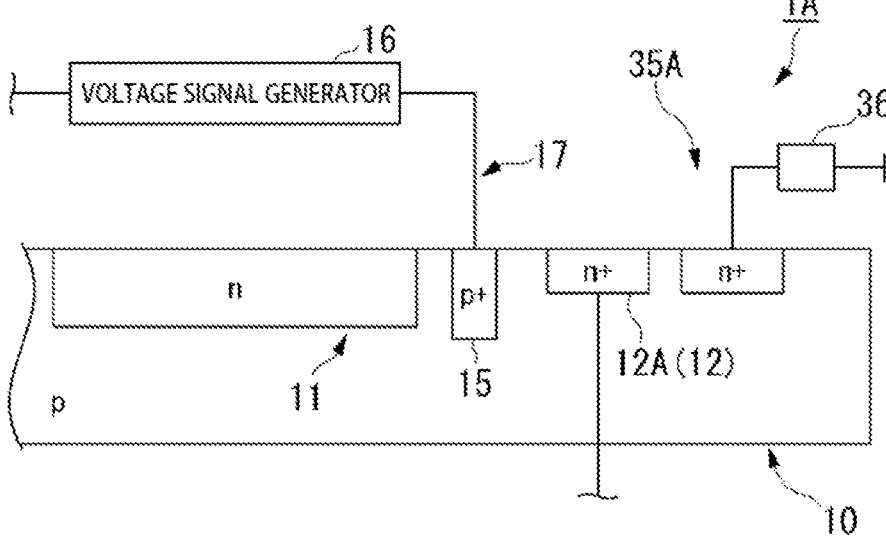
FIG. 7 is a partial schematic diagram illustrating a solid-state image sensor according to a modification of the present invention.

FIG. 7 illustrates a modification where the solid-state image sensor 1A includes the reset transistors 35A. In this case, the same effect as above can be achieved. The solid-state image sensor 1A of FIG. 7 includes a transfer controller 17 and thus is configured to perform selective carrier transfer in response to external voltages. With this configuration, the first semiconductor 10 includes no FET gates when the reset transistors 35A are provided. Thus, the manufacturing process can be greatly simplified, resulting in a significant reduction in the manufacturing cost.

Figure 8:
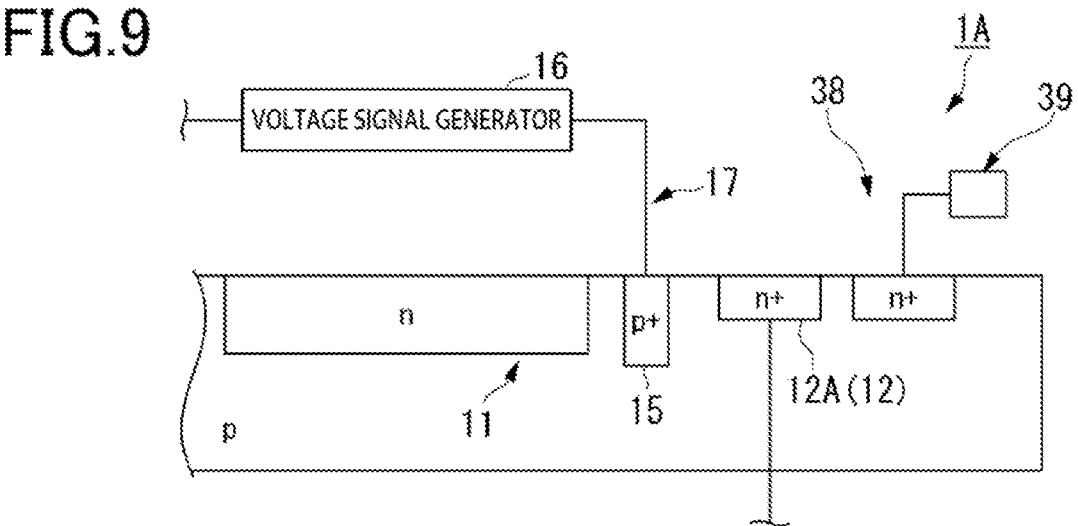
FIG. 8 is a partial schematic diagram illustrating a solid-state image sensor according to a modification of the present invention.

FIG. 8 illustrates a modification where the first semiconductor 10 of the present embodiment includes drain structures 38 each configured to cause signal charge carriers (electrons in the case of a p-type first semiconductor 10) to discharge. The drain structures 38 each include a voltage signal generator 39. Unwanted charge carriers in the first carrier storage 12A are discharged into the corresponding drain structure 38 upon application of a reverse-bias voltage to the drain structure 38 from the corresponding voltage signal generator 39 to cause a reverse-bias condition relative to the first semiconductor 10. Thus, unwanted charge carriers are removed in advance, which improves a signal-to-noise (S/N) ratio of a signal for selective carrier transfer.

FIG. 9 illustrates a solid-state image sensor 1A including drain structures 38. In this case as well, the first semiconductor 10 needs no FET gates.

In the solid-state image sensors of FIGS. 8 and 9, each of the drain structures 38 may be combined with the reset transistor 35A. In this case, each drain structure 38 and the corresponding reset transistor 35A may share part of their structure.

Figure 10:
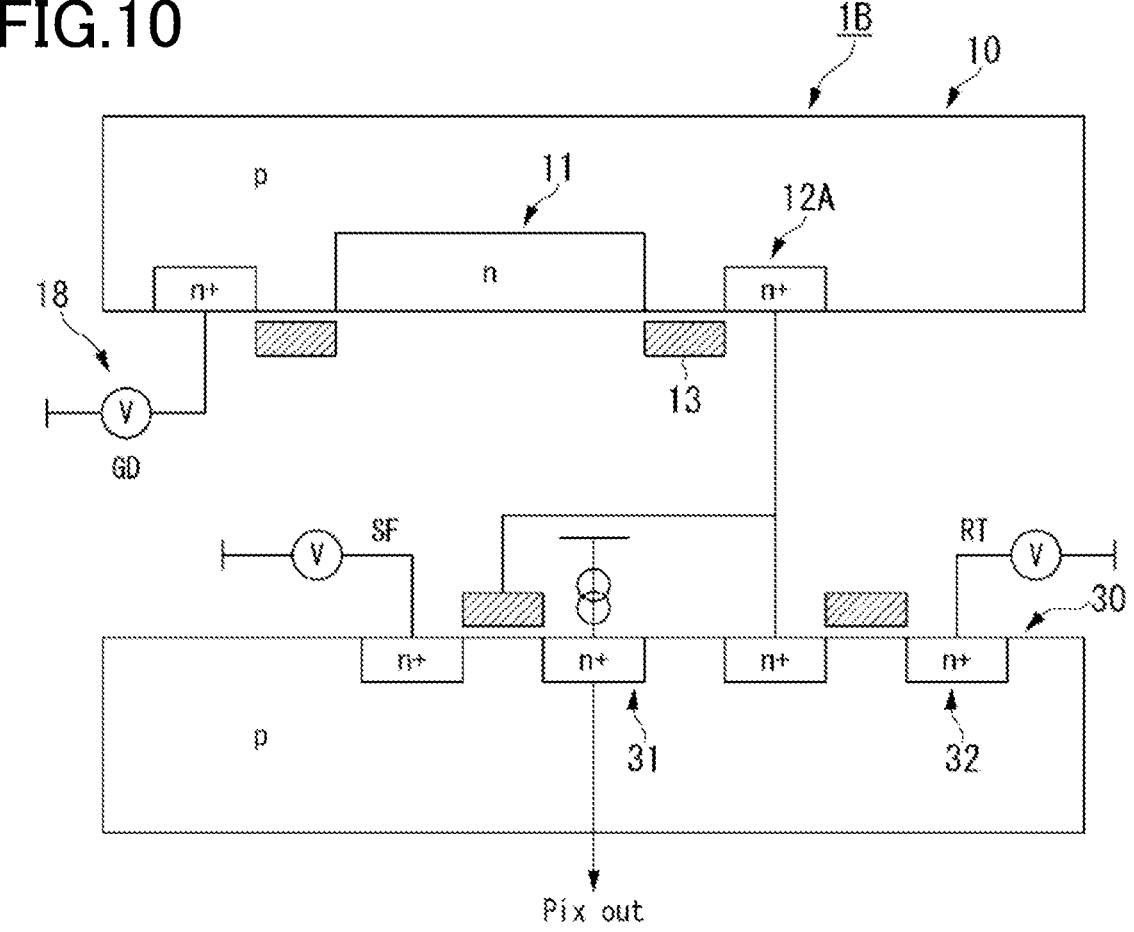
FIG. 10 is a schematic diagram illustrating a solid-state image sensor according to a modification of the present invention.

As with the solid-state image sensor 1B of the modification illustrated in FIG. 10, a carrier discharger 18 coupled to the photodiode 11 via a gate may be provided in the first semiconductor 10. In this case, during a period of time when selective carrier transfer is not performed in the first semiconductor 10, charge carriers generated in the photodiode 11 due to incident light or a dark current can be suitably discharged. In FIG. 10, the other first carrier storage 12B and corresponding components of the second semiconductor 30 are omitted because they are difficult to illustrate in the same drawing sheet.

Figure 11:
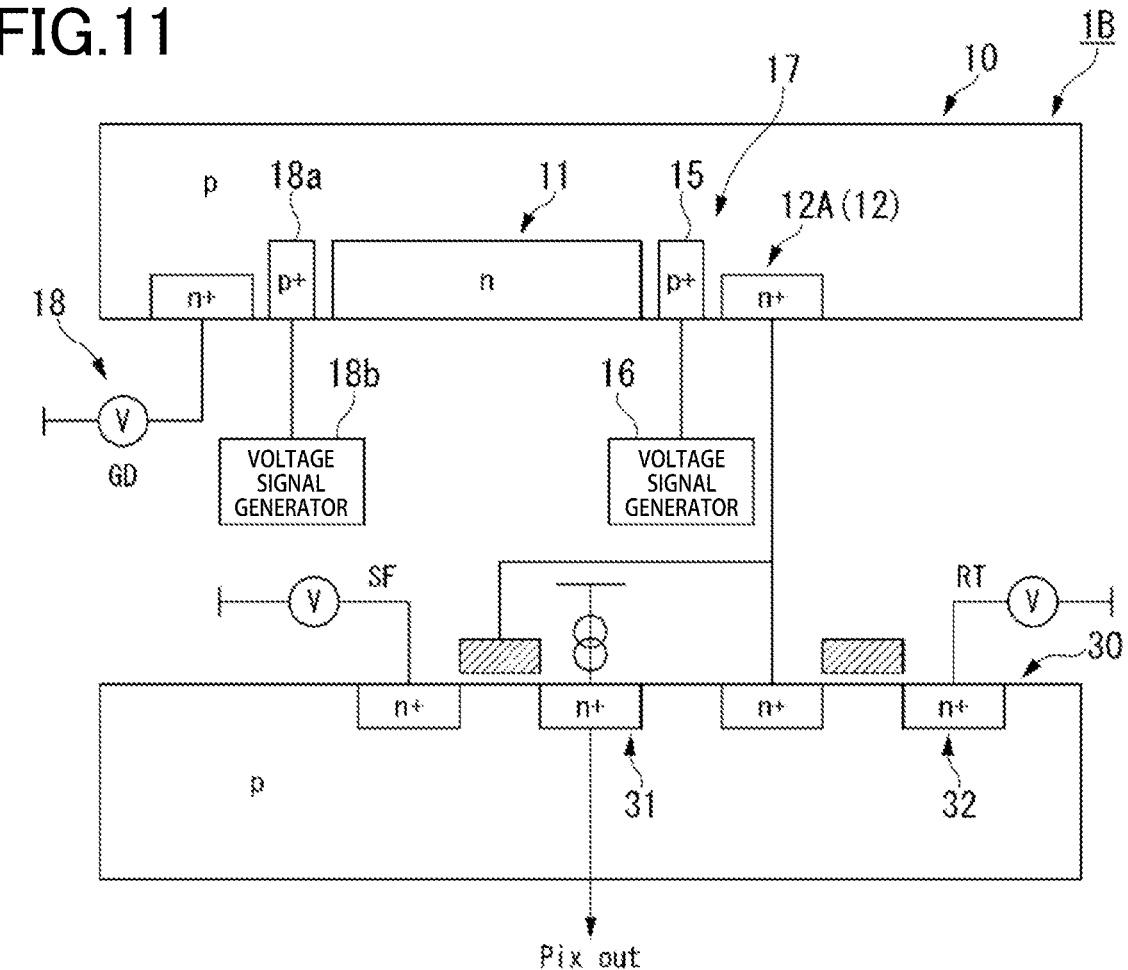
FIG. 11 is a schematic diagram illustrating a solid-state image sensor according to a modification of the present invention.

FIG. 11 illustrates a modification of the solid-state image sensor 1B where the transfer gate 13 is replaced with a transfer controller 17 including a p+ semiconductor region 15 and a voltage signal generator 16, and the gate of the carrier discharger 18 is replaced with a p+ semiconductor region 18a and a voltage signal generator 18b. In this case as well, the first semiconductor 10 includes no FET gates, and thus the above advantage can be obtained.

The carrier discharger 18 may be combined with a reset transistor or a drain structure.

The present application addresses the following. The device described in PTL 1 includes a first semiconductor with photodiodes formed therein, and a second semiconductor disposed on a silicon substrate. Although charge carriers generated by the photodiodes in the first semiconductor are transferred to the second semiconductor for subsequent carrier-to-voltage conversion, PTL 1 does not specifically describe the manner in which the charge carriers are transferred from the first semiconductor to the second semiconductor, but it only illustrates, by way of example, a known interconnection using conductive wiring and a diffusion layer.

In a solid-state imaging device, charge carriers generated in a photodiode may be subjected to selective transfer to one of a plurality of carrier-storage regions. PTL 1 discloses a time-of-flight (ToF) optical sensor in which charge carriers transferred to a second semiconductor are subjected to selective transfer to one of two carrier-storage regions.

However, when the first and second semiconductors of the device disclosed in PTL 1 are coupled to each other in the above example manner, the presence of a diffusion layer between the photodiode and gates that perform selective carrier transfer may actually interfere with appropriate selective carrier transfer.

In view of the above circumstances, the present invention has an aspect to provide a solid-state image sensor that efficiently uses near-infrared or short-wave infrared light and that performs appropriate selective carrier transfer.

A solid-state image sensor according to a first aspect of the present invention includes a first semiconductor having a first composition, and a second semiconductor having a second composition different from the first composition and electrically connected to the first semiconductor.

The first semiconductor includes a photodiode configured to convert light incident on the photodiode into charge carriers; a plurality of first carrier storages for storing the charge carriers; and a transfer controller configured to transfer the charge carriers to a selected one of the first carrier storages.

The second semiconductor includes a plurality of second carrier storages and a potential detector. The second carrier storages correspond to the respective first carrier storages and are each configured to store charge carriers based on the charge carriers stored in a corresponding one of the first carrier storages. The potential detector is configured to detect the electric potential of each of the second carrier storages.

The solid-state image sensor further includes a resetter configured to reset the electric potential of each of the first carrier storages to a predetermined electric potential.

An imaging system according to a second aspect of the present invention includes a light source unit configured to emit light having a predetermined wavelength profile; and a solid-state image sensor according to the first aspect.

The above aspects of the present invention enable efficient use of near-infrared or short-wave infrared light and appropriate selective carrier transfer.

REFERENCE SIGNS LIST

1, 1A, 1B . . . Solid-state image sensor
10 . . . First semiconductor
11 . . . Photodiode
12, 12A, 12B . . . First carrier storage
13 . . . Transfer gate (transfer controller)
17 . . . Transfer controller
30 . . . Second semiconductor
31 . . . Potential detection node (Potential detector)
33 . . . Second carrier storage
35, 35A . . . Reset transistor (Resetter)
40 . . . Solid-state imaging device
100 . . . Imaging system
110 . . . Light source unit
L1 . . . Outgoing light Obviously, numerous modifications and variations of the present invention are possible in light of the above teachings. It is therefore to be understood that within the scope of the appended claims, the invention may be practiced otherwise than as specifically described herein.

What is claimed is:

1. A solid-state image sensor, comprising:
a first semiconductor having a first composition and including
a photodiode configured to convert light incident on the photodiode into charge carriers,
a plurality of first carrier storages configured to store the charge carriers, and
a transfer controller configured to control transfer of the charge carriers to a selected one of the first carrier storages, the transfer controller being positioned between the photodiode and the selected one of the first carrier storages;

a second semiconductor having a second composition different from the first composition, the second semiconductor being electrically connected to the first semiconductor, the second semiconductor including a plurality of second carrier storages corresponding to the respective first carrier storages, which are included in the first semiconductor having the first composition, each of the second carrier storages being configured to store charge carriers based on the charge carriers stored in a corresponding one of the first carrier storages, which is included in the first semiconductor having the first composition, and a potential detector configured to detect an electric potential of each of the second carrier storages; and a resetter configured to reset an electric potential of each of the first carrier storages, which is included in the first semiconductor having the first composition, to a predetermined electric potential.

2. The solid-state image sensor according to claim 1, wherein the resetter, which is configured to reset the electric potential of each of the first carrier storages, which is included in the first semiconductor having the first composition, to the predetermined electric potential, is mounted to the first semiconductor.

3. An imaging system, comprising:

a light source unit configured to emit light having a predetermined wavelength profile; and the solid-state image sensor of claim 2.

4. The imaging system according to claim 3, wherein the light source unit is configured to emit near-infrared light or short-wave infrared light.

5. The solid-state image sensor according to claim 1, wherein the photodiode comprises germanium as a main element thereof.

6. An imaging system, comprising:

a light source unit configured to emit light having a predetermined wavelength profile; and the solid-state image sensor of claim 5.

7. The imaging system according to claim 6, wherein the light source unit is configured to emit near-infrared light or short-wave infrared light.

8. An imaging system, comprising:

a light source unit configured to emit light having a predetermined wavelength profile; and the solid-state image sensor of claim 1.

9. The imaging system according to claim 8, wherein the light source unit is configured to emit near-infrared light or short-wave infrared light.

* * * * *